United States Patent
Li et al.

(10) Patent No.: US 8,443,249 B2
(45) Date of Patent: May 14, 2013

(54) SYSTEMS AND METHODS FOR LOW DENSITY PARITY CHECK DATA ENCODING

(75) Inventors: Zongwang Li, San Jose, CA (US); Kiran Gunnam, San Jose, CA (US); Shaohua Yang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 355 days.

(21) Appl. No.: 12/767,761

(22) Filed: Apr. 26, 2010

(65) Prior Publication Data

US 2011/0264987 A1    Oct. 27, 2011

(51) Int. Cl.
*H03M 13/00*    (2006.01)

(52) U.S. Cl.
USPC .......................................... 714/752; 714/755

(58) Field of Classification Search .................. 714/752, 714/785, 755
See application file for complete search history.

(56) References Cited

U.S. PATENT DOCUMENTS

| | | | |
|---|---|---|---|
| 5,278,846 A | 1/1994 | Okayama et al. | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,065,149 A | 5/2000 | Yamanaka | |
| 6,097,764 A | 8/2000 | McCallister et al. | |

(Continued)

FOREIGN PATENT DOCUMENTS

| | | |
|---|---|---|
| EP | 0522578 | 1/1993 |
| EP | 1814108 | 8/2007 |

(Continued)

OTHER PUBLICATIONS

U.S. Appl. No. 11/461,026, filed Jul. 31, 2006, Tan, Weijun.

(Continued)

*Primary Examiner* — Philip Guyton
(74) *Attorney, Agent, or Firm* — Hamilton DeSanctis & Cha

(57) ABSTRACT

Various embodiments of the present invention provide systems and methods for encoding data. As an example, a data encoding circuit is disclosed that includes a first stage data encoder circuit and a second stage data encoder circuit. The first stage data encoder circuit is operable to provide a first stage output. The first stage data encoder circuit includes a first vector multiplier circuit operable to receive a data input and to multiply the data input by a first sparse matrix to yield a first interim value. The second stage encoder circuit includes a second vector multiplier circuit operable to multiply the first stage output by a second sparse matrix to yield a second interim value.

19 Claims, 6 Drawing Sheets

U.S. PATENT DOCUMENTS

| | | | |
|---|---|---|---|
| 6,145,110 A | 11/2000 | Khayrallah | |
| 6,216,249 B1 | 4/2001 | Bliss et al. | |
| 6,216,251 B1 | 4/2001 | McGinn | |
| 6,229,467 B1 | 5/2001 | Eklund et al. | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |
| 6,657,803 B1 | 12/2003 | Ling et al. | |
| 6,671,404 B1 | 12/2003 | Katawani et al. | |
| 6,748,034 B2 | 6/2004 | Hattori et al. | |
| 6,757,862 B1 | 6/2004 | Marianetti | |
| 6,785,863 B2 | 8/2004 | Blankenship et al. | |
| 6,788,654 B1 | 9/2004 | Hashimoto et al. | |
| 6,810,502 B2 | 10/2004 | Eidson | |
| 6,980,382 B2 | 12/2005 | Hirano et al. | |
| 6,986,098 B2 | 1/2006 | Poeppelman et al. | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greenberg et al. | |
| 7,093,179 B2 | 8/2006 | Shea | |
| 7,113,356 B1 | 9/2006 | Wu | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghavan et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,313,752 B2 * | 12/2007 | Kyung et al. | 714/801 |
| 7,370,258 B2 | 5/2008 | Iancu et al. | |
| 7,403,752 B2 | 7/2008 | Raghavan et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,587,657 B2 | 9/2009 | Haratsch | |
| 7,590,168 B2 | 9/2009 | Raghavan et al. | |
| 7,702,989 B2 | 4/2010 | Graef et al. | |
| 7,712,008 B2 | 5/2010 | Song et al. | |
| 7,752,523 B1 | 7/2010 | Chaichanavong et al. | |
| 7,801,200 B2 | 9/2010 | Tan | |
| 7,802,163 B2 | 9/2010 | Tan | |
| 8,161,345 B2 * | 4/2012 | Graef | 714/752 |
| 2003/0063405 A1 | 4/2003 | Jin et al. | |
| 2003/0081693 A1 | 5/2003 | Raghavan et al. | |
| 2003/0087634 A1 | 5/2003 | Raghavan et al. | |
| 2003/0112896 A1 | 6/2003 | Raghavan et al. | |
| 2003/0134607 A1 | 7/2003 | Raghavan et al. | |
| 2004/0071206 A1 | 4/2004 | Takatsu | |
| 2004/0098659 A1 | 5/2004 | Bjerke et al. | |
| 2005/0010855 A1 | 1/2005 | Lusky | |
| 2005/0111540 A1 | 5/2005 | Modrie et al. | |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song | |
| 2006/0195772 A1 | 8/2006 | Graef et al. | |
| 2006/0248435 A1 | 11/2006 | Haratsch | |
| 2006/0256670 A1 | 11/2006 | Park et al. | |
| 2006/0291571 A1 * | 12/2006 | Divsalar et al. | 375/242 |
| 2007/0011569 A1 | 1/2007 | Casado et al. | |
| 2007/0047635 A1 | 3/2007 | Stojanovic et al. | |
| 2007/0110200 A1 | 5/2007 | Mergen et al. | |
| 2007/0230407 A1 | 10/2007 | Petrie et al. | |
| 2007/0286270 A1 | 12/2007 | Huang et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0168330 A1 | 7/2008 | Graef et al. | |
| 2008/0276156 A1 | 11/2008 | Gunnam | |
| 2008/0301521 A1 | 12/2008 | Gunnam | |
| 2009/0199071 A1 | 8/2009 | Graef | |
| 2009/0235116 A1 | 9/2009 | Tan et al. | |
| 2009/0235146 A1 | 9/2009 | Tan | |
| 2009/0259915 A1 | 10/2009 | Livshitz et al. | |
| 2009/0273492 A1 | 11/2009 | Yang et al. | |
| 2009/0274247 A1 | 11/2009 | Galbraith et al. | |
| 2010/0002795 A1 | 1/2010 | Raghaven et al. | |
| 2010/0050043 A1 | 2/2010 | Savin | |
| 2010/0061492 A1 | 3/2010 | Noelder | |
| 2010/0070837 A1 | 3/2010 | Xu et al. | |
| 2010/0164764 A1 | 7/2010 | Nayak | |
| 2010/0185914 A1 | 7/2010 | Tan et al. | |
| 2010/0325511 A1 * | 12/2010 | Oh et al. | 714/752 |
| 2011/0191653 A1 * | 8/2011 | Zeng et al. | 714/763 |
| 2012/0089884 A1 * | 4/2012 | Kamiya | 714/752 |

FOREIGN PATENT DOCUMENTS

| | | |
|---|---|---|
| WO | WO 2006/016751 | 2/2006 |
| WO | WO 2006/134527 | 12/2006 |
| WO | WO 2007/091797 | 8/2007 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,330, filed Sep. 21, 2010, Zhang, et al.
U.S. Appl. No. 12/887,369, filed Sep. 21, 2010, Liu et al.
U.S. Appl. No. 12/901,816, filed Oct. 11,2010, Li et al.
U.S. Appl. No. 12/917,756, filed Nov. 2, 2010, Miladinovic et al.
U.S. Appl. No. 12/947,931, filed Nov. 17, 2010, Yang, Shaohua.
U.S. Appl. No. 12/947,947, filed Nov. 17, 2010, Ivkovic et al.
U.S. Appl. No. 12/972,942, filed Dec. 20, 2010, Liao et al.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding" [online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gunnam, K et al. "Tech. Note on Iterative LDPC Solutions for Turbo Equal.", K. Gunnam, G. Choi and M. Yeary, TX A&M Tech. Note, Rpt. Dt: 07/06 Avail. online dropzone.tamu.edu.
K. Gunnam et al., "Next Generation iterative LDPC solutions for magnetic recording storage," invited paper. The Asilomar Conference on Signals, Systems, and Computers, Nov. 2008.
Han and Ryan, "Pinning Techniques for Low-Floor Detection/Decoding of LDPC-Coded Partial Response Channels", 5th International Symposium on Turbo Codes &Related Topics, 2008.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Mohsenin et al., "Split Row: A Reduced Complexity, High Throughput LDPC Decoder Architecture", pp. 1-6, printed from www.ece.ucdavis.edu on Jul. 9, 2007.
Sari H et al., "Transmission Techniques for Digital Terrestrial TV Broadcasting" IEEE Communications Magazine, IEEE Service Center Ny, NY vol. 33, No. 2 Feb. 1995.

UNK, "Auto threshold and Auto Local Threshold" [online] [retr. May 28, 2010] Retr. from the Internet www.dentristy.bham.ac.uk/landinig/software/autothreshold/autothreshold.html.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Wang Y et al., "A Soft Decision Decoding Scheme for Wireless COFDM With App. To DVB-T" IEEE Transactions on Consumer elect., IEEE Service Center, NY,NY vo. 50, No. 1 Feb. 2004.

Weon-Cheol L. et al., "Vitierbi Decoding Method Using Channel State Information in COFDM System" IEEE Trans. on Consumer Elect., IEEE Service Center, NY, NY vol. 45 No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Youn, "BER Perf. Due to Irreg. of Row-Weoght Distr. of the Parity-Check Matirx in Irregular LDPC Codes for 10-Gb/s Optical Signals" Journal of Lightwave Tech., vol. 23 Sep. 9, 2005.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. on Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF(q)"(dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

* cited by examiner

| Hp11<br>m1*w1<br>472 | Hp12<br>m1*w2<br>474 | Hu1=u1<br>m1*k<br>476 |
|---|---|---|
| Hp21<br>m2*w1<br>482 | Hp22<br>m2*w2<br>484 | Hu2=u2<br>m2*k<br>486 |

SYSTEMS AND METHODS FOR LOW DENSITY PARITY CHECK DATA ENCODING

BACKGROUND OF THE INVENTION

The present inventions are related to data processing, and more particularly to systems and methods for encoding data.

Data storage and transmission systems typically encode a data set prior to either storage or transmission. Robust encoding facilitates enhanced data recovery and in some cases error correction. As a general rule, an increase in the robustness of an encoding approach results in an increase in circuit complexity. Such circuit complexity may not be practical, and yet enhanced data recovery may be desired.

Hence, for at least the aforementioned reasons, there exists a need in the art for advanced systems and methods for encoding data.

BRIEF SUMMARY OF THE INVENTION

The present inventions are related to data processing, and more particularly to systems and methods for encoding data.

Various embodiments of the present invention provide data encoding circuits that include a first stage data encoder circuit and a second stage data encoder circuit. The first stage data encoder circuit is operable to provide a first stage output. The first stage data encoder circuit includes a first vector multiplier circuit operable to receive a data input and to multiply the data input by a first sparse matrix to yield a first interim value. The second stage encoder circuit includes a second vector multiplier circuit operable to multiply the first stage output by a second sparse matrix to yield a second interim value. The data encoding circuit may be implemented as part of a data storage system, a data transmission system, or another system.

In some instances of the aforementioned embodiments, the first sparse matrix and the second sparse matrix are part of an encoding matrix. This encoding matrix includes a quasi-cyclic code portion, and a non-quasi-cyclic code portion. In such cases, both the first sparse matrix and the second sparse matrix are part of the quasi-cyclic portion. In some instances of the aforementioned embodiments, the first stage encoder circuit further includes a third vector multiplier circuit operable to multiply the first interim value by a third sparse matrix to yield a third interim value. In some such cases, the first sparse matrix, the second sparse matrix, and the third sparse matrix are part of an encoding matrix that includes a quasi-cyclic code portion, and a non-quasi-cyclic code portion. In such cases, the third sparse matrix may be part of the non-quasi-cyclic portion. In one or more cases, the first stage data encoder circuit further includes an XOR array circuit operable to XOR the first interim value with the second interim value to yield a fourth interim value. In some such cases, the first stage data encoder circuit further includes a fourth vector multiplier circuit operable to multiply the fourth interim value by a dense matrix to yield a subset of the first stage output. In one or more such cases, the first sparse matrix, the second sparse matrix, the third sparse matrix, and a dense matrix are part of an encoding matrix. The encoding matrix includes a quasi-cyclic code portion, and a non-quasi-cyclic code portion, and the dense matrix is part of the non-quasi-cyclic portion.

In some instances of the aforementioned embodiments, the second stage encoder circuit further includes an XOR array circuit operable to XOR the second interim value by the first interim value to yield a third interim value. In some cases, the second stage encoder circuit further includes a third multiplier circuit operable to multiply the third interim value by a third sparse matrix to yield an encoded output.

Other embodiments of the present invention provide methods for performing data encoding. Such methods include receiving a data input and performing a first stage encoding of the data input to yield a first stage output. The first stage encoding includes multiplying the data input by a sparse matrix to yield an interim value. The methods further include performing a second stage encoding utilizing the first stage output and the interim value.

In some instances of the aforementioned embodiments, the interim value is a first interim value, the sparse matrix is a first sparse matrix, and the first stage encoding includes multiplying the data input by a second sparse matrix to yield a second interim value; and XORing the first interim value and the second interim value to yield a third interim value. In some of the aforementioned instance, the method further includes performing a syndrome encoding that includes XORing the third interim value by a syndrome pattern to yield a fourth interim value. Such instances may further include multiplying the fourth interim value by a dense matrix to yield a subset of the first stage output. In one or more instances of the aforementioned embodiments, the interim value is a first interim value, the sparse matrix is a first sparse matrix, and performing a second stage encoding includes: multiplying the first stage output by a second sparse matrix to yield a second interim value; XORing the first interim value and the second interim value to yield a third interim value; and multiplying the third interim value by a third sparse matrix to yield an encoded output.

Yet other embodiments of the present invention provide storage devices that include an encoding matrix having a quasi-cyclic code portion and a non-quasi-cyclic code portion. The non-quasi-cyclic portion includes a dense matrix, a first sparse matrix and a second sparse matrix. The quasi-cyclic portion includes a third sparse matrix, a fourth sparse matrix, and a fifth sparse matrix.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to data processing, and more particularly to systems and methods for encoding data.

Various embodiments of the present invention provide a multi-stage encoder circuit. Such multi-stage encoder circuits utilize a hybrid encoding matrix including blocks (i.e., sub-matrices) with lower weight circulants, and other blocks with higher weight circulants. In some cases, the encoding matrix is modified such that one of the blocks associated with the higher weight circulants is all zeros. The encoding matrix is defined such that the blocks can be maintained in sparse form even when the block is inverted. In some embodiments of the present invention, syndrome encoding can be applied as part of one stage of the encoding process. In some cases, the blocks are full rank sparse matrices, and the encoder stages do not utilize forward or backward substitution processes and thereby offer reduced complexity encoding.

Figure 1:
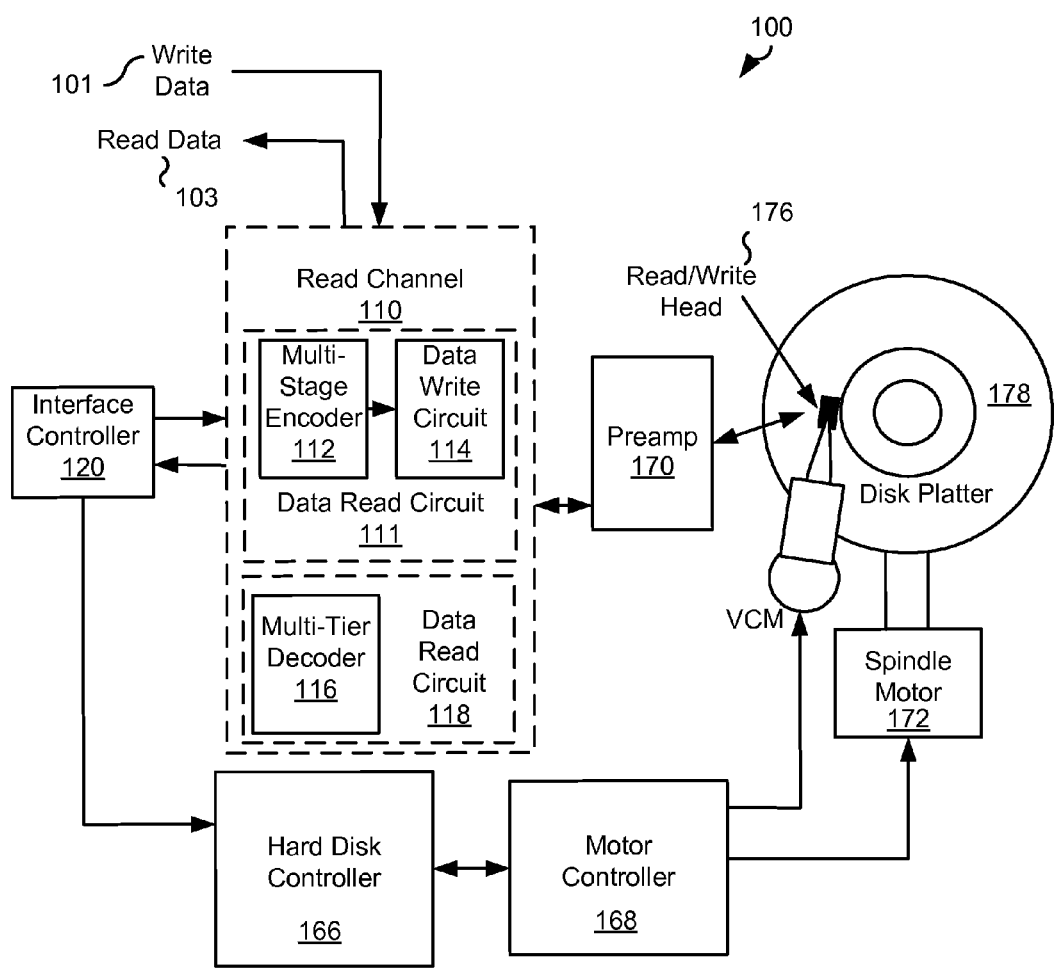
FIG. 1 depicts a storage device including a read channel with a multi-stage encoder circuit in accordance with various embodiments of the present invention.

Turning to FIG. 1, a storage system 100 is shown including a read channel 110 including a data write circuit 111 and a data read circuit 118. Storage system 100 may be, for example, a hard disk drive. Based upon the disclosure provided herein, one of ordinary skill in the art will recognize a variety of storage systems that may include the circuitry discussed in relation to FIG. 1. Data write circuit 111 includes a multi-stage encoder circuit 112 in accordance with various embodiments of the present invention, and a data write circuit 114. Multi-stage encoder circuit 112 may be implemented similar to those described below in relation to one or more of FIGS. 4-5, and/or may operate in accordance with the flow diagram of FIG. 6. Data read circuit 118 receives data retrieved from a disk platter 178 and performs a data decode process using a decoder 156. The data decode process substantially reverses the encoding originally applied by multi-stage encoder circuit 112.

In addition, storage system 100 includes a preamplifier 170 that amplifies a minute electrical signal received from a read/write head assembly 176. Read/write head assembly 176 is disposed in relation to disk platter 178. Storage system 100 also includes an interface controller 120, a hard disk controller 166, a motor controller 168, and a spindle motor 172. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. In other embodiments of the present invention, disk platter 178 includes magnetic signals recorded in accordance with a longitudinal recording scheme.

In a read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 278 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to data read circuit 118 of read channel 110 via preamplifier 170. Preamplifier 170 is operable to amplify the minute analog signals accessed from disk platter 178. In turn, data read circuit 118 decodes the received information using decoder 116 as part of a process of digitizing the received analog signal to recreate the information originally written to disk platter 178. This data is provided as read data 103 to a receiving circuit.

A write operation is substantially the opposite of the preceding read operation. In particular, write data 101 is received by data write circuit 111 of read channel 110. Write data 101 is encoded by encoder circuit 112, and the encoded data is provided to a data write circuit 114. Data write circuit 114 drives the encoded data to preamplifier 170. The data amplified by preamplifier 170 are provided to read/write head assembly 176 that generates a corresponding magnetic field that is recorded on disk platter 178 at locations controlled by motor controller 168.

Figure 2:
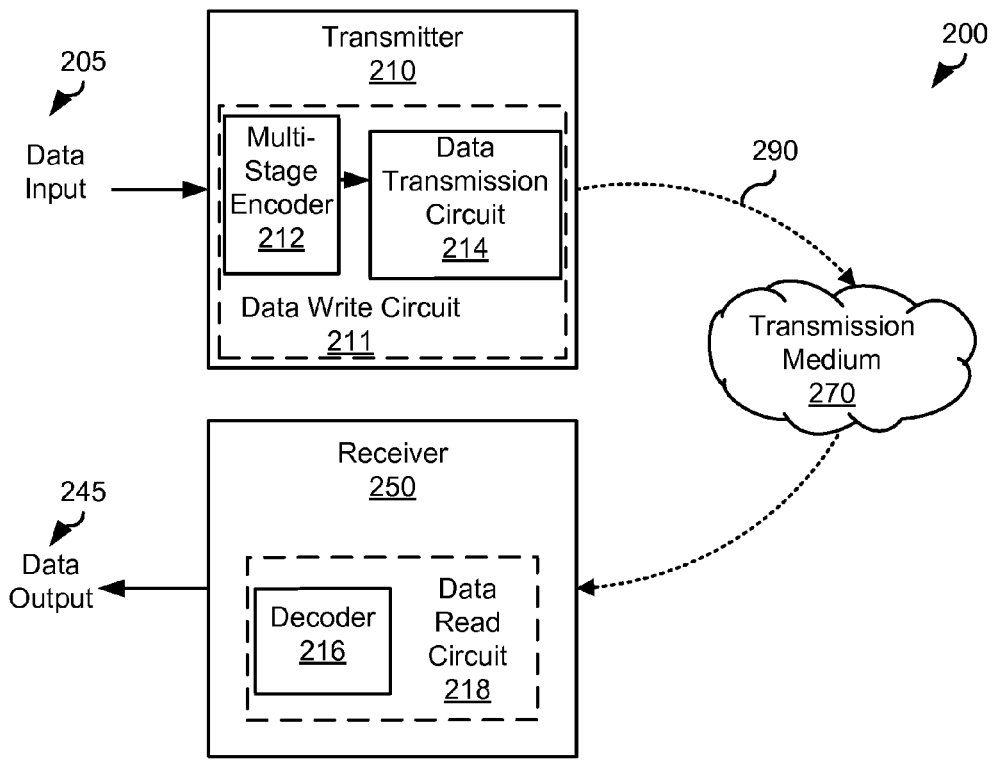
FIG. 2 depicts a data transmission system including a multi-stage encoder circuit in accordance with one or more embodiments of the present invention.

Turning to FIG. 2, a transmission system 200 is shown including a read channel 110 including a transmitter 210 and a receiver 250. Transmission system 200 may be, for example, two cellular telephones or radio sets. Based upon the disclosure provided herein, one of ordinary skill in the art will recognize a variety of transmission systems that may include the circuitry discussed in relation to FIG. 2. Transmitter 210 includes a multi-stage encoder circuit 212 in accordance with various embodiments of the present invention, and a data write circuit 214. Multi-stage encoder circuit 212 may be implemented similar to those described below in relation to one or more of FIGS. 4-5, and/or may operate in accordance with the flow diagram of FIG. 6. Receiver 250 receives data received from transmitter 210 via a transmission system 270. Receiver 250 includes a data read circuit 258 having a decoder 256. Decoder 256 implements a decode process that substantially reverses the encoding originally applied by multi-stage encoder circuit 212.

In operation, a data input 205 is provided to transmitter 210. Multi-stage encoder circuit 212 encodes the received data input and provides an encoded output to a data transmission circuit 214. Data transmission circuit 214 converts the data into a radio frequency signal 290 that is transmitted via transmission system 270. Receiver 250 receives the radio frequency signal that is processed by data read circuit 258. Such processing includes data decoding by a decoder 256. Ultimately, the decoded data is provided as a data output 245 which corresponds to data input 205.

Figures 3, 4:
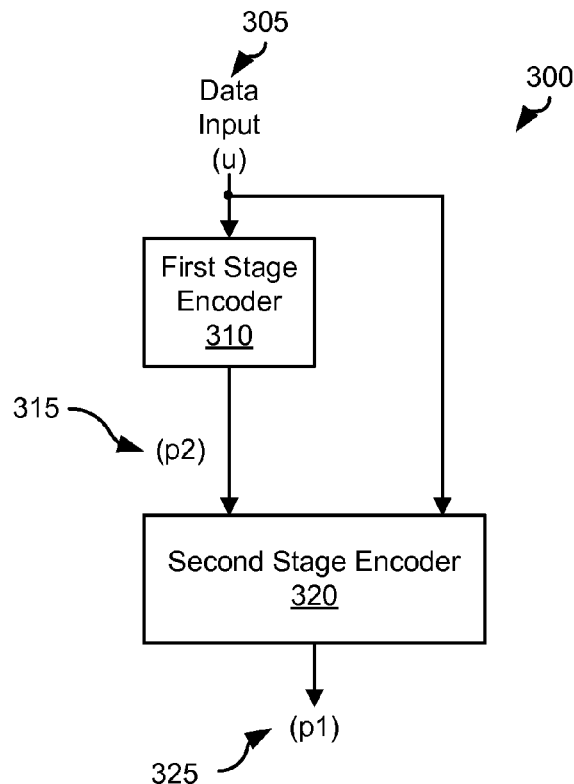
FIG. 3 depicts a multi-stage encoder circuit in accordance with various embodiments of the present invention.
FIG. 4 is a representation of an encoding matrix including user data and two levels of parity data in accordance with one or more embodiments of the present invention.

Turning to FIG. 3, a multi-stage encoder circuit 300 is shown in accordance with various embodiments of the present invention. Multi-stage encoder circuit 300 includes a first stage encoder circuit 310 applying a first level of encoding, and a second stage encoder circuit 320 applying a second level of encoding. Where input data is received (block 605), a first level encoding process is applied to the input data (block 610). Both the first level encoding and the second level encoding are performed using an encoding matrix similar to that described below in relation to FIG. 4, and both levels of encoding are applied such that the following equation is maintained true:

$$[0 \tilde{H}p22 - Hp21 \times (Hp11)^{-1} \times Hu1 \times Hu2] \times \begin{bmatrix} p1 \\ p2 \\ u \end{bmatrix} \equiv 0,$$

where p1 is a set of first level parity bits generated by the encoding process, p2 is a set of second level parity bits generated by the encoding process, and u is a set of received input data. $\tilde{H}p22=-Hp21\times(Hp11)^{-1}\times Hu1\times Hu2$ which is a sparse matrix derived from the matrices Hp11, Hp12, Hp21 and Hp22 of the utilized encoding matrix. This modification assures that the sub-matrix in the original Hp21 position is all zeros. This modification to the encoding matrix operates to simplify the encoding process. First stage encoder circuit 310 receives a data input 305 (designated as "u"), and provides a first stage output 315 (designated as "p2"). Second stage encoder circuit 320 receives first stage output 315 and data input 305, and provides a second stage output 325 (designated "p1").

Data input 305 may be any data received from a supplying circuit or data input. In one particular embodiment of the present invention, data input 305 is a series of binary values. In other embodiments of the present invention, data input 305 is a series of parallel data transfers each of a width w. Based upon the disclosure provided herein, one of ordinary skill in the art will recognize a variety of sources of data input 305 and/or a variety of formats of data input 305.

Turning to FIG. 4, a representation of an encoding matrix 400 including user encode data 476, 486 and two levels of parity data ((p1), (p2)) in accordance with one or more embodiments of the present invention. User encode data 476 includes a number of data bits arranged into a quasi-cyclic low density parity check matrix of size m1×k. Quasi-cyclic low density parity check codes are known in the art and allow implementation of low complexity encoding and decoding circuitry. In some embodiments of the present invention, user encode data 476 is assembled such that it exhibits lower row weight relative to user encode data 486, and exhibiting all zero matrices. In one particular embodiment of the present invention m1 is four hundred, eighty (480) and k is four thousand, five hundred, twelve (47*96).

User encode data 486 includes a number of data bits arranged into a non-quasi-cyclic low density parity check matrix of size m2×k. Such non-quasi-cyclic low density parity check matrices utilize more complex encoding and decoding processes, but offer additional advantages when compared with quasi-cyclic low density parity check codes as are known in the art. In some particular embodiments, user data 486 includes ninety-six (96) or one hundred, ninety two (192) check equations. In one particular embodiment of the present invention m2 is on hundred, ninety two (192) and k is four thousand, five hundred, twelve (47*96).

A first level of parity encode data (p2) is separated into two parity regions 474, 484. Parity encode data 474 includes a number of parity bits (the number of bits is equal to m1*w2) arranged in an array of size m1×w2. In one particular embodiment of the present invention, m1 is four hundred, eighty (480), m2 is one hundred, ninety two (192), and w2 is one hundred, ninety two (192). Parity encode data 484 includes a number of parity bits (the number of bits is equal to m2*w2) arranged in an array of size m2×w2. In one particular embodiment of the present invention, m2 is one hundred, ninety two (192), and w2 is one hundred, ninety two (192). A second level of parity encode data (p(1)) is separated into two parity regions 472, 482. Parity encode data 472 includes a number of parity bits (the number of bits is equal to m1*w1) arranged in an array of size m1×w1. In one particular embodiment of the present invention m1 is four-hundred-eighty (5×96) and w1 is four-hundred-eighty (5×96). Parity encode data 482 includes a number of parity bits (the number of bits is equal to w1) arranged in an array of size m2×w1. In one particular embodiment of the present invention m2 is one hundred, ninety two (2×96) and w1 is four-hundred-eighty (5×96). User encode data 486 and parity encode data 484 are modified such that parity encode data 482 is all zeros. This modification is a change in the encoding matrix that simplifies the encoding process.

Referring back to FIG. 3, in operation, data input 305 is processed by encoder circuit 310 and encoder circuit 320 using encoding matrix 400. Subsequently, output 315 of first stage encoder circuit 310 and user data 305 is processed using encoding matrix 400.

Figure 5A:
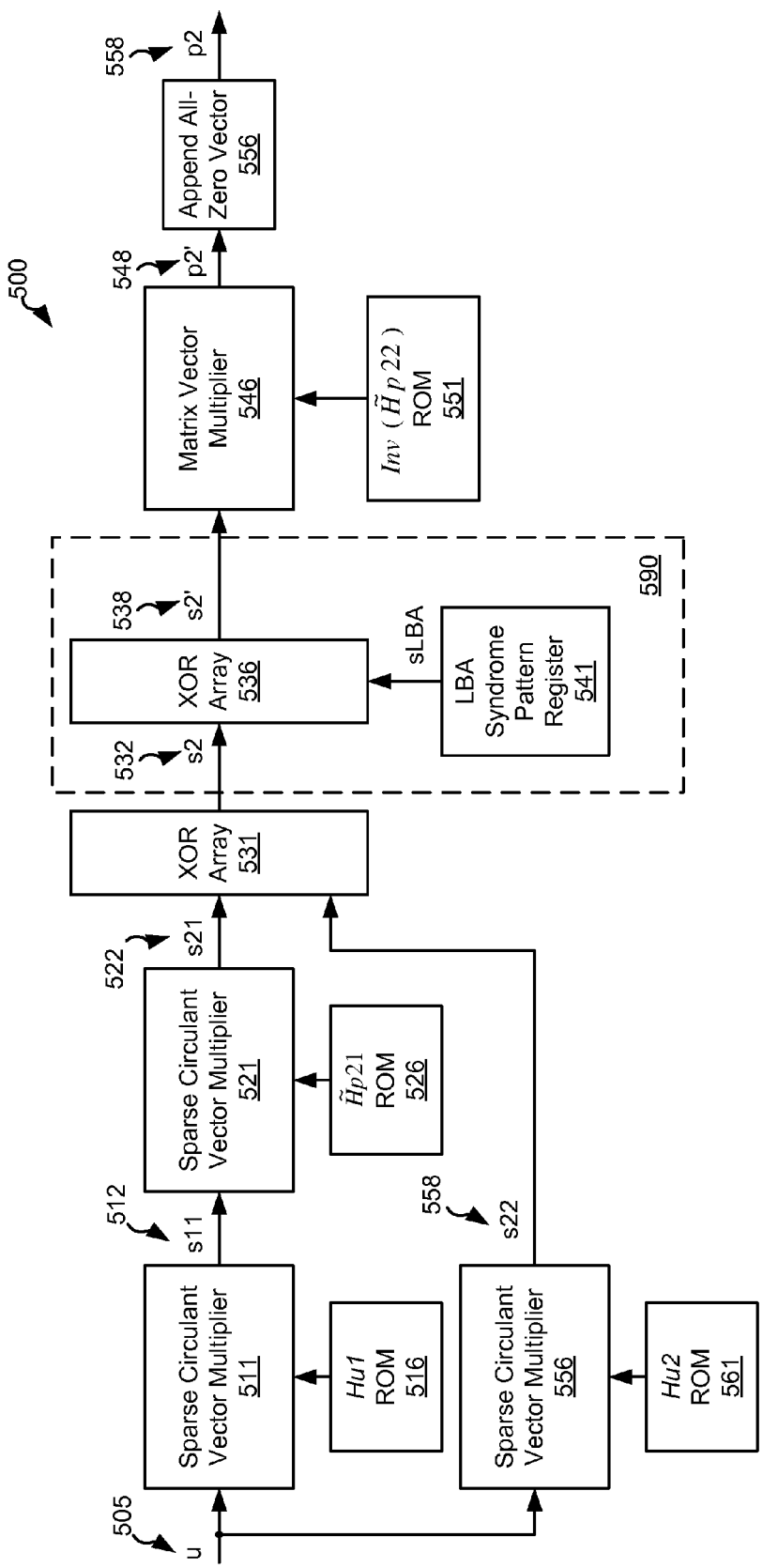
FIG. 5a is a detailed diagram of one implementation of a first stage of a multi-stage encoder circuit in accordance with some embodiments of the present invention.

Turning to FIG. 5a, a detailed diagram of a first stage encoder circuit 500 is shown. First stage encoder circuit 500 may be used in place of first stage encoder circuit 310 in various embodiments of the present invention. First stage encoder circuit 500 includes a sparse circulant vector multiplier circuit 511 that receives user data 505 (u) that is multiplied by user encode data 476 (Hu1) to yield an interim value 512 (s11) as set forth in the following equation:

$s11=Hu1*u.$

User encode data 476 is available from a pre-programmed Hu1 read only memory 516, and is a sparse matrix in circulant form. Interim value 512 is provided to another sparse circulant vector multiplier circuit 521. Sparse circulant vector multiplier circuit 521 multiplies interim value 512 by the modified parity encode data 482 ($\tilde{H}p21$) to yield another interim value 522 (s21) as set forth in the following equation:

$s21=\tilde{H}p21*s11.$

The modified parity encode data 482 ($\tilde{H}p21$) is available from a preprogrammed $\tilde{H}p21$ read only memory 526, and is a sparse matrix in circulant form.

In parallel, the received user data 505 (u) is multiplied by user encode data 486 (Hu2) using another sparse circulant vector multiplier circuit 556 to yield another interim value 558 (s22) as set forth in the following equation:

$s22=Hu2*u.$

User encode data 486 is available from a pre-programmed Hu2 read only memory 561, and is a sparse matrix in circulant form. Interim value 522 (s21) and interim value 558 (s22) are provided to an XOR array circuit 531 where the two interim values are XORd to yield another interim value 532 (s2) as set forth in the following equation:

$s2=s21 \otimes s22.$

Interim output 532 (s2) is provided to a syndrome calculation circuit 590. Syndrome calculation circuit includes an XOR array circuit 536 that XORs interim output 532 by a preprogrammed value (sLBA) in an LBA syndrome pattern register 541 to yield another interim value 538 (s2') in accordance with the following equation:

$s2'=s2 \otimes sLBA.$

Where such syndrome encoding is applied where, for example, there are one hundred, ninety-two rows of H2 (i.e., the combination of $\tilde{H}u2$, $\tilde{H}p22$ and $\tilde{H}p21$), the encoder can support up to one hundred, ninety-one LBA bits along with syndrome pattern to improve error floor and mis-correction rate. In such a case, sLBA is the mapping of LBA bits to the partial syndrome for H2. Interim value 538 is provided to a matrix vector multiplier 546 where it is multiplied by the inverse of the modified parity encode data 484 (Inv($\tilde{H}$p22)) to yield another interim value 548 (p2') as set forth in the following equation:

$$p2'=s2'^{*}\text{Inv}(\tilde{H}p22).$$

Parity encode data 484 is available from a pre-programmed Inv($\tilde{H}$p22) read only memory 551, and is a dense matrix. The density is a result of the non-cyclic part of the high row weight block. For a real quasi-cyclic code, Inv($\tilde{H}$p22) can also be found in sparse circulant form as Inv(Hp11). If $\tilde{H}$p22 is not a full rank matrix, a sub-matrix of $\tilde{H}$p22 derived from $\tilde{H}$p22 has the same rank as $\tilde{H}$p22.

In one particular embodiment, Inv($\tilde{H}$p22) is a dense matrix with a size of 192×192. Interim value 548 is modified by an append all-zero vector circuit 556. The modification includes filling out an array size with zeros in all of the unfilled locations to yield a first stage output 558 (p2).

Figure 5B:
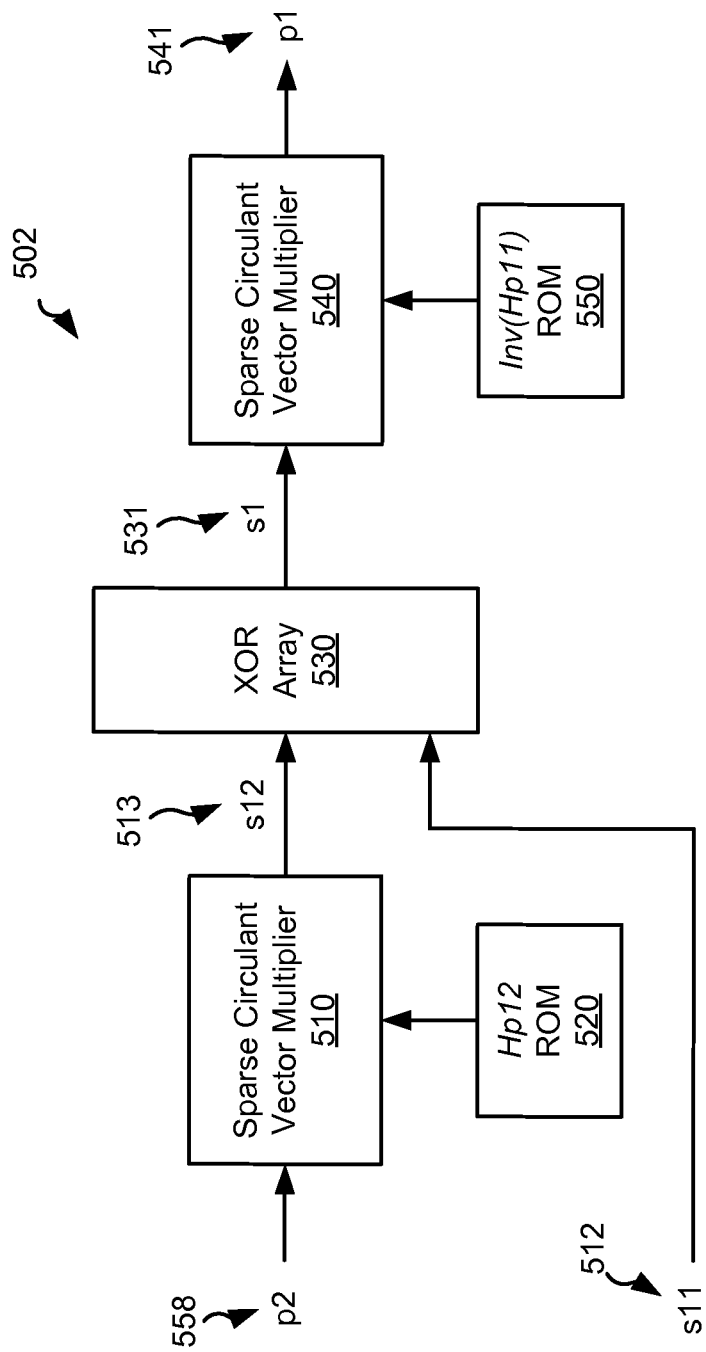
FIG. 5b is a detailed diagram of a second stage of a multi-stage encoder circuit in accordance with some embodiments of the present invention.

Turning to FIG. 5b, a detailed diagram of a second stage encoder circuit 502 of a multi-stage encoder circuit in accordance with some embodiments of the present invention. Second stage encoder circuit 502 may be used in place of second stage encoder circuit 320 in various embodiments of the present invention. Second stage encoder circuit 502 includes sparse circulant vector multiplier circuit 510 that receives first stage output 558 (p2) and multiplies it by parity encode data 474 (Hp12) to yield an interim value 513 (s12) as set forth in the following equation:

$$s12=Hp12^{*}p2.$$

Parity encode data 574 is available from pre-programmed Hp12 read only memory 520. An XOR array circuit 530 XORs interim value 513 with interim value 512 to yield another interim value 531 (s1) in accordance with the following equation:

$$s1=s12 \otimes s11.$$

Interim value 531 (s1) is provided to another sparse circulant vector multiplier circuit 540 where it is multiplied by the inverse of parity encode data 472 (Inv(Hp11)) to yield a second stage output 541 (p1) in accordance with the following equation:

$$p1=\text{Inv}(Hp11)^{*}s1.$$

The inverse of parity encode data 472 is available from a pre-programmed Inv(Hp11) read only memory 550.

Figure 5C:
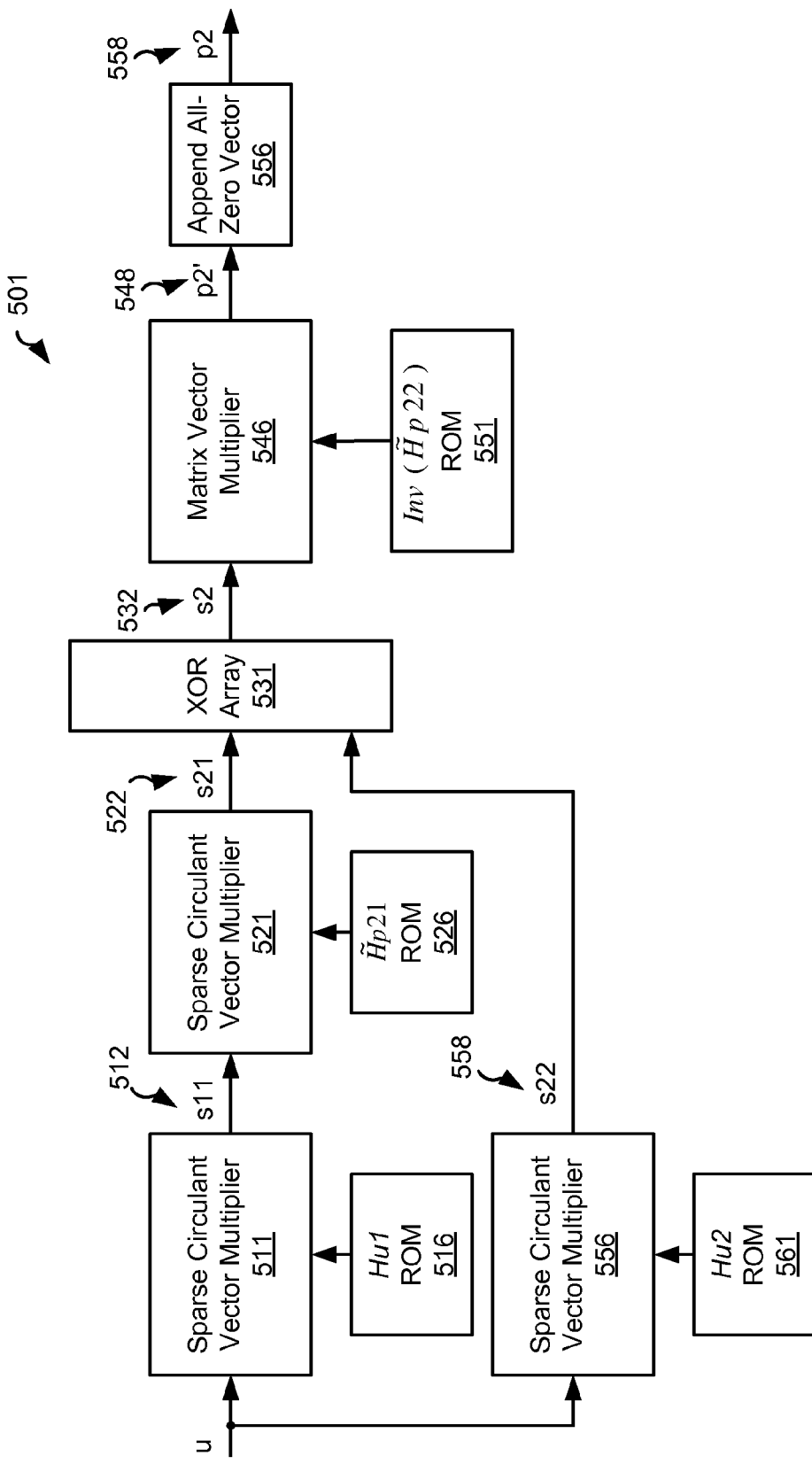
FIG. 5c is a detailed diagram of another implementation of a first stage of a multi-stage encoder circuit in accordance with some embodiments of the present invention.

Turning to FIG. 5c, a detailed diagram of an alternative first stage encoder circuit 501 is shown. First stage encoder circuit 501 is similar to the previously described first stage encoder circuit 500 except that the syndrome calculation circuit is eliminated. First stage encoder circuit 501 may be used in place of first stage encoder circuit 310 in various embodiments of the present invention. First stage encoder circuit 501 includes sparse circulant vector multiplier circuit 511 that receives user data 505 (u) that is multiplied by user encode data 476 (Hu1) to yield interim value 512 (s11) as set forth in the following equation:

$$s11=Hu1^{*}u.$$

User encode data 476 is available from pre-programmed Hu1 read only memory 516. Interim value 512 is provided to sparse circulant vector multiplier circuit 521. Sparse circulant vector multiplier circuit 521 multiplies interim value 512 by the modified parity encode data 482 ($\tilde{H}$p21) to yield another interim value 522 (s21) as set forth in the following equation:

$$s21=\tilde{H}p21^{*}s11.$$

The modified parity encode data 482 (Hp21) is available from preprogrammed $\tilde{H}$p21 read only memory 526.

In parallel, the received user data 505 (u) is multiplied by user encode data 486 (Hu2) using sparse circulant vector multiplier circuit 556 to yield interim value 558 (s22) as set forth in the following equation:

$$s22=Hu2^{*}u.$$

User encode data 486 is available from pre-programmed Hu2 read only memory 561. Interim value 522 (s21) and interim value 558 (s22) are provided to XOR array circuit 531 where the two interim values are XORd to yield interim value 532 (s2) as set forth in the following equation:

$$s2=s21 \otimes s22.$$

Interim output 532 (s2) is provided to matrix vector multiplier 546 where it is multiplied by the inverse of the modified parity encode data 484 (Inv($\tilde{H}$p22)) to yield another interim value 548 (p2') as set forth in the following equation:

$$p2'=s2'^{*}\text{Inv}(\tilde{H}p22).$$

Parity encode data 484 is available from a pre-programmed Inv($\tilde{H}$p22) read only memory 551. Interim value 548 is modified by append all-zero vector circuit 556. The modification includes filling out an array size with zeros in all of the unfilled locations to yield a first stage output 558 (p2).

Figure 6:
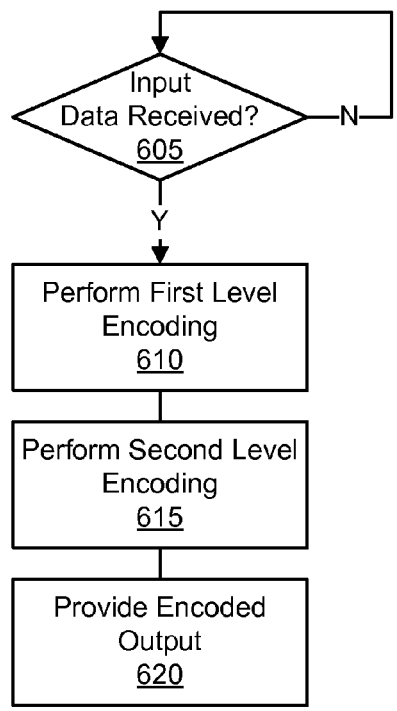
FIG. 6 is a flow diagram showing a method for multi-stage encoding in accordance with some embodiments of the present invention.

Turning to FIG. 6, a flow diagram 600 shows a method for multi-stage encoding in accordance with some embodiments of the present invention. Following flow diagram 600, it is determined whether input data is received (block 605). Such input data may be received from any source including, but not limited to, a host processor. Based upon the disclosure provided herein, one of ordinary skill in the art will recognize a variety of data sources that may be used in relation to different embodiments of the present invention.

Where input data is received (block 605), a first level encoding process is applied to the input data (block 610). Both the first level encoding and the second level encoding are performed using an encoding matrix similar to that described above in relation to FIG. 4, and both levels of encoding are applied such that the following equation is maintained true:

$$[0\tilde{H}p22 - Hp21 \times (Hp11)^{-1} \times Hu1 \times Hu2] \times \begin{bmatrix} p1 \\ p2 \\ u \end{bmatrix} \equiv 0,$$

where p1 is a set of first level parity bits generated by the encoding process, p2 is a set of second level parity bits generated by the encoding process, and u is a set of received input data. $\tilde{H}$p22=−Hp21×(Hp11)$^{-1}$×Hu1×Hu2 which is a sparse matrix derived from the matrices Hp11, Hp12, Hp21 and Hp22 of the utilized encoding matrix. This modification assures that the sub-matrix in the original Hp21 position is all zeros. This modification to the encoding matrix operates to simplify the encoding process.

Using the equivalence defined above and the available encoding matrix, the first level encoding includes multiplying the received input data (u) by a sparse matrix (Hu1) to yield an interim value (s11) in accordance with the following equation:

$$s11=Hu1^{*}u.$$

The interim value (s11) is then multiplied by another sparse matrix (Hp21) to yield another interim value (s21) in accordance with the following equation:

$$s21=\tilde{H}p21*s11.$$

The sparse matrix $\tilde{H}p21$ is itself a sparse matrix and is defined by the following equation:

$$\tilde{H}p21=-Hp21*\mathrm{Inv}(Hp11),$$

Where Inv(Hp11) is the inverse of sparse matrix Hp11 that is itself another sparse matrix.

In parallel, the received input data (u) is multiplied by sparse matrix $\tilde{H}u2$ to yield another interim value (s22) as set forth in the following equation:

$$s22=\tilde{H}u2*u.$$

The interim value (s22) is XORd with the interim value (s21) to yield another interim value (s2) in accordance with the following equation:

$$s2=s22 \otimes s21.$$

The interim value s2 is then multiplied by the inverse of encoding matrix $\tilde{H}p22$ (i.e., Inv($\tilde{H}p22$)) to yield another interim value p2' in accordance with the following equation:

$$p2'=\mathrm{Inv}(\tilde{H}p22) \times s2.$$

Then, the matrix p2' is filled out with zeros to be of the appropriate size to yield p2. p2 is the result of the first level encoding process.

Once the first level encoding process is completed (block 610), a second level encoding process is applied (block 615). Such second level encoding includes multiplying the result of the first level encoding (p2) by a sparse matrix Hp12 to yield an interim value s12 in accordance with the following equation:

$$s12=Hp12*p2.$$

The interim value s12 and the interim value s11 from the first level encoding are XORd together to yield another interim value s1 in accordance with the following equation:

$$s1=s12 \otimes s11.$$

The interim value s1 is multiplied by the inverse of sparse vector Hp11 (i.e., Inv(Hp11)) to yield the encoded output p1 in accordance with the following equation:

$$p1=s1*\mathrm{Inv}(Hp11).$$

Once computed, the encoded data is provided as an output (block 620).

In conclusion, the invention provides novel systems, devices, methods, formats and arrangements for data encoding. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data encoding circuit, the data encoding circuit comprising:
    a first stage data encoder circuit including a first vector multiplier circuit operable to receive a data input and to multiply the data input by a first sparse matrix to yield a first interim value, and wherein the first stage data encoder circuit is operable to provide a first stage output; and
    a second stage encoder circuit including a second vector multiplier circuit operable to multiply a third interim value by a second sparse matrix to yield a second interim value, and wherein the second stage encoder circuit further includes a third vector multiplier circuit operable to multiply the data input by a third sparse matrix to yield the third interim value.

2. The data encoding circuit of claim 1, wherein the first sparse matrix and the second sparse matrix are part of an encoding matrix.

3. The data encoding circuit of claim 2, wherein the encoding matrix includes a quasi-cyclic code portion, and a non-quasi-cyclic code portion.

4. The data encoding circuit of claim 3, wherein both the first sparse matrix and the second sparse matrix are part of the quasi-cyclic portion.

5. The data encoding circuit of claim 1, wherein the first sparse matrix, the second sparse matrix, and the third sparse matrix are part of an encoding matrix, wherein the encoding matrix includes a quasi-cyclic code portion, and a non-quasi-cyclic code portion, and wherein the third sparse matrix is part of the non-quasi-cyclic portion.

6. The data encoding circuit of claim 1, wherein the first stage data encoder circuit further includes an XOR array circuit operable to XOR the first interim value with the second interim value to yield a fourth interim value.

7. The data encoding circuit of claim 6, wherein the first stage data encoder circuit further includes a fourth vector multiplier circuit operable to multiply the fourth interim value by a dense matrix to yield a subset of the first stage output.

8. The data encoding circuit of claim 7, wherein the first sparse matrix, the second sparse matrix, the third sparse matrix, and a dense matrix are part of an encoding matrix, wherein the encoding matrix includes a quasi-cyclic code portion, and a non-quasi-cyclic code portion, and wherein the dense matrix is part of the non-quasi-cyclic portion.

9. The data encoding circuit of claim 1, wherein the data encoding circuit is implemented as part of a system selected from a group consisting of: a data storage system, and a data transmission system.

10. A method for performing data encoding, the method comprising:
    receiving a data input;
    performing a first stage encoding of the data input to yield a first stage output, wherein the first stage encoding includes multiplying the data input by a first sparse matrix to yield a first interim value;
    performing a second stage encoding utilizing the first stage output and the interim value;
    multiplying the data input by a second sparse matrix to yield a second interim value; and
    XORing the first interim value and the second interim value to yield a third interim value.

11. The method of claim 10, wherein the method further comprises:
    performing a syndrome encoding, wherein the syndrome encoding includes XORing the third interim value by a syndrome pattern to yield a fourth interim value.

12. The method of claim 11, wherein the method further comprises:
    multiplying the fourth interim value by a dense matrix to yield a subset of the first stage output.

13. A storage device, wherein the storage device includes:
    an encoding circuit utilizing an encoding matrix having a quasi-cyclic code portion and a non-quasi-cyclic code portion; wherein the non-quasi-cyclic portion includes a dense matrix, a first sparse matrix and a second sparse matrix; and wherein the quasi-cyclic portion includes a third sparse matrix, a fourth sparse matrix, and a fifth sparse matrix.

14. The storage device of claim 13, wherein the storage device is implemented as part of an encoding circuit, and wherein the encoding circuit includes:
- a first stage data encoder circuit including a first vector multiplier circuit operable to receive a data input and to multiply the data input by the third sparse matrix to yield a first interim value, a second vector multiplier circuit operable to multiply the first interim value by the second sparse matrix to yield a second interim value, a third vector multiplier circuit operable to multiply the data input by the first sparse matrix to yield a third interim value, and an XOR array circuit operable to XOR the second interim value with the third interim value to yield a fourth interim value, and a circuit operable to generate a first stage output based at least in part on the fourth interim value; and
- a second stage encoder circuit including a fourth vector multiplier circuit operable to multiply the first stage output by the fourth sparse matrix to yield a fifth interim value, an XOR array circuit operable to XOR the fifth interim value with the first interim value to yield a sixth interim value; and a fifth vector multiplier circuit operable to multiply the sixth interim value by the fifth sparse matrix to yield an encoded output.

15. An encoding system, the encoding system comprising:
- a first stage encoding circuit including a vector multiplier circuit operable to multiply a first interim value by a first matrix to yield a second interim value, wherein the first interim value is derived from a data input; and
- an XOR array circuit operable to XOR the second interim value with a third interim value to yield a fourth interim value, wherein the third interim value is derived from the data input.

16. The encoding system of claim 15, wherein the vector multiplier circuit is a first vector multiplier circuit, and wherein the first stage encoding circuit further comprises:
- a second vector multiplier circuit operable to multiply the data input by a second matrix to yield the first interim value.

17. The encoding system of claim 16, wherein the encoding system further comprises:
- a second stage encoding circuit including a third vector multiplier circuit operable to multiply the data input by a third matrix to yield the third interim value.

18. The encoding system of claim 17, wherein the encoding system further comprises:
- a fourth vector multiplier circuit operable to multiply an encoded input derived from the fourth interim value to yield an encoded output.

19. The data encoding system of claim 15, wherein the system is implemented as part of an integrated circuit.

* * * * *